(12) United States Patent
Qiu et al.

(10) Patent No.: US 10,698,453 B2
(45) Date of Patent: Jun. 30, 2020

(54) CAMERA MODULE AND MOBILE TERMINAL

(71) Applicant: GUANGDONG OPPO MOBILE TELECOMMUNICATIONS CORP., LTD., Dongguan (CN)

(72) Inventors: Zeshuo Qiu, Dongguan (CN); Yu Jiang, Dongguan (CN); Yunhui Peng, Dongguan (CN); Ke Ran, Dongguan (CN)

(73) Assignee: GUANGDONG OPPO MOBILE TELECOMMUNICATIONS CORP., LTD, Dongguan, Guangdong (CN)

( * ) Notice: Subject to any disclaimer, the term of this patent is extended or adjusted under 35 U.S.C. 154(b) by 0 days.

(21) Appl. No.: 16/136,690

(22) Filed: Sep. 20, 2018

(65) Prior Publication Data

US 2019/0094920 A1    Mar. 28, 2019

(30) Foreign Application Priority Data

Sep. 26, 2017    (CN) .......................... 2017 1 0886755

(51) Int. Cl.
| | |
|---|---|
| G03B 17/00 | (2006.01) |
| G06F 1/16 | (2006.01) |
| H04M 1/02 | (2006.01) |
| H04N 5/225 | (2006.01) |
| H05K 1/18 | (2006.01) |

(52) U.S. Cl.
CPC .......... *G06F 1/1686* (2013.01); *G06F 1/1605* (2013.01); *G06F 1/1652* (2013.01); *H04M 1/0264* (2013.01); *H04M 1/0277* (2013.01); *H04N 5/2256* (2013.01);

(Continued)

(58) Field of Classification Search
USPC ........................................................ 396/542
See application file for complete search history.

(56) References Cited

U.S. PATENT DOCUMENTS

| | | | | |
|---|---|---|---|---|
| 3,836,824 A | * | 9/1974 | Watrous ................... | G03B 9/70 361/749 |
| 4,215,387 A | * | 7/1980 | Negishi .................. | H05K 1/147 361/751 |

(Continued)

FOREIGN PATENT DOCUMENTS

| | | |
|---|---|---|
| CN | 1518384 A | 8/2004 |
| CN | 202035072 U | 11/2011 |

(Continued)

OTHER PUBLICATIONS

First Office Action issued in corresponding China application No. 2019040801594780, dated Apr. 11, 2019 (12 pages).

(Continued)

*Primary Examiner* — Rodney E Fuller
(74) *Attorney, Agent, or Firm* — Ladas & Parry, LLP

(57) ABSTRACT

A mobile terminal includes a casing and a camera module. The camera module is received in the casing. The camera module includes a camera, a flash lamp, an electrical connector, and a flexible printed circuit (FPC). The FPC has a first end and a second end opposite to the first end. The camera is coupled to the first end of the FPC, and the electrical connector is coupled to the second end of the FPC. The flash lamp is disposed on the FPC. A camera module of the mobile terminal is also provided.

20 Claims, 6 Drawing Sheets

(52) U.S. Cl.
CPC .......... *H04N 5/2257* (2013.01); *H05K 1/189* (2013.01); *H04M 1/0274* (2013.01)

(56) References Cited

U.S. PATENT DOCUMENTS

| | | | |
|---|---|---|---|
| 2004/0061799 A1* | 4/2004 | Atarashi | G02B 7/022 |
| | | | 348/340 |
| 2004/0132491 A1* | 7/2004 | Kim | H04M 1/0218 |
| | | | 455/556.1 |
| 2005/0047776 A1 | 3/2005 | Watanabe et al. | |
| 2006/0276059 A1 | 12/2006 | Dittmann et al. | |
| 2007/0069395 A1* | 3/2007 | Kim | H01L 27/14618 |
| | | | 257/780 |
| 2008/0079829 A1* | 4/2008 | Choi | H01L 27/14618 |
| | | | 348/294 |
| 2008/0131112 A1* | 6/2008 | Aoki | G03B 17/48 |
| | | | 396/429 |
| 2008/0143870 A1 | 6/2008 | Tanaka et al. | |
| 2011/0255000 A1* | 10/2011 | Weber | G03B 17/02 |
| | | | 348/374 |
| 2014/0313403 A1* | 10/2014 | Chen | H04N 5/2252 |
| | | | 348/373 |
| 2018/0054554 A1* | 2/2018 | Xie | H04N 5/2253 |
| 2018/0198966 A1* | 7/2018 | Tang | G03B 35/00 |

FOREIGN PATENT DOCUMENTS

| | | |
|---|---|---|
| CN | 102542694 A | 7/2012 |
| CN | 102752501 A | 10/2012 |
| CN | 102857680 A | 1/2013 |
| CN | 203135950 U | 8/2013 |
| CN | 205961267 U | 2/2017 |
| CN | 206020901 U | 3/2017 |
| CN | 206235797 U | 6/2017 |
| CN | 106961791 A | 7/2017 |
| CN | 107197125 A | 9/2017 |
| CN | 107529002 A | 12/2017 |
| KR | 20080051449 A | 6/2008 |
| KR | 20090018486 A | 2/2009 |
| KR | 20090048049 A | 5/2009 |
| WO | 2013073108 A1 | 5/2013 |

OTHER PUBLICATIONS

International Search Report and Written Opinion issued in corresponding International application No. 2018106527, dated Nov. 29, 2018 (11 pages).

European Search Report issued in corresponding European application No. 18195679.8-1221, dated Feb. 11, 2019 (9 pages).

Second Office Action issued in corresponding China application No. 201710886755.X, dated Jul. 8, 2019 (13 pages).

* cited by examiner

CAMERA MODULE AND MOBILE TERMINAL

CROSS-REFERENCE TO RELATED APPLICATION

This application claims priority to a Chinese application No. 201710886755.X filed on Sep. 26, 2017, titled "CAMERA MODULE AND MOBILE TERMINAL". The entirety of the above-mentioned application is hereby incorporated by reference herein.

TECHNICAL FIELD

The present disclosure relates to the field of consumer devices in general. More particularly, and without limitation, the disclosed embodiments relate to a camera module and a mobile terminal.

BACKGROUND

A mobile phone can include a casing (i.e., a rear cover), a camera, and a flash lamp. The camera and the flash lamp can be disposed in the casing. The camera and the flash lamp need to be arranged in a desired manner.

SUMMARY

In accordance with an aspect, in one embodiment of the present disclosure, a camera module is provided. The camera module includes a camera, a flash lamp, an electrical connector, and a flexible printed circuit (FPC). The FPC has a first end and a second end opposite to the first end. The camera is coupled to the first end of the FPC, and the electrical connector is coupled to the second end of the FPC. The flash lamp is disposed on the FPC.

In another aspect, a mobile terminal is provided. The mobile terminal includes a casing and a camera module. The camera module is received in the casing. The camera module includes a camera, a flash lamp, an electrical connector, and a flexible printed circuit (FPC). The FPC has a first end and a second end opposite to the first end. The camera is coupled to the first end of the FPC, and the electrical connector is coupled to the second end of the FPC. The flash lamp is disposed on the FPC.

In further another aspect, a mobile terminal is provided. The mobile terminal can include a casing, and a camera module received in the casing. The camera module can include an electrical connector, a camera spaced, a flexible printed circuit board (FPC), and a flash lamp. The camera is spaced from the electrical connector. The FPC is arranged between the camera and the electrical connector and is coupled to the camber and the electrical connector. The flash lamp is arranged on the FPC.

BRIEF DESCRIPTION OF THE DRAWINGS

The accompanying drawings, which are incorporated in and constitute a part of this specification, illustrate exemplary embodiments of the present disclosure, and together with the description, serve to explain the principles of the disclosure.

DETAILED DESCRIPTION OF EMBODIMENTS

Figure 1:
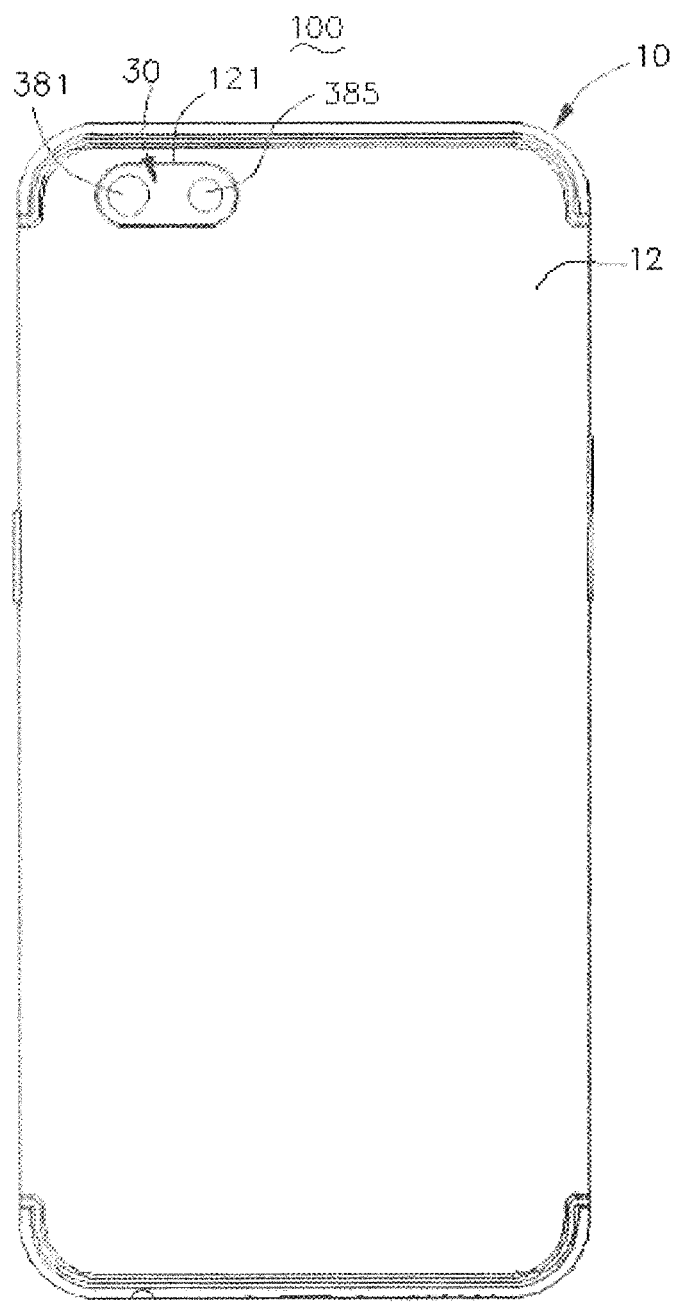
FIG. 1 illustrates a schematic view of a mobile terminal, in accordance with a first embodiment of the present disclosure.

This description and the accompanying drawings that illustrate exemplary embodiments should not be taken as limiting. Various mechanical, structural, electrical, and operational changes may be made without departing from the scope of this description and the claims, including equivalents. In some instances, well known structures and techniques have not been shown or described in detail so as not to obscure the disclosure. Similar reference numbers in two or more figures represent the same or similar elements. Furthermore, elements and their associated features that are disclosed in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

As used herein, a "communication terminal" (or simply a "terminal") can include, but is not limited to, a device that is configured to receive/transmit communication signals via wire line connection, such as via public-switched telephone network (PSTN), digital subscriber line (DSL), digital cable, a direct cable connection, and/or another data connection/network, and/or via wireless interface with, for example, a cellular network, a wireless local area network (WLAN)1 a digital television network such as a DVB-II network, a satellite network, an AM/FM broadcast transmitter, and/or another communication terminal. A communication terminal that is configured to communicate over a wireless interface may be referred to as a "wireless communication terminal," a "wireless terminal" and/or a "mobile terminal." Examples of mobile terminals include, but are not limited to, a satellite or cellular radiotelephone; a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other appliance that can include a radiotelephone transceiver.

In accordance with an aspect, in one embodiment of the present disclosure, a camera module is provided. The camera module includes a camera, a flash lamp, an electrical connector, and a flexible printed circuit (FPC). The FPC has a first end and a second end opposite to the first end. The camera is coupled to the first end of the FPC, and the electrical connector is coupled to the second end of the FPC. The flash lamp is disposed on the FPC.

In another aspect, a mobile terminal is provided. The mobile terminal includes a casing and a camera module. The camera module is received in the casing. The camera module includes a camera, a flash lamp, an electrical connector, and a flexible printed circuit (FPC). The FPC has a first end and a second end opposite to the first end. The camera is coupled to the first end of the FPC, and the electrical connector is coupled to the second end of the FPC. The flash lamp is disposed on the FPC.

In further another aspect, a mobile terminal is provided. The mobile terminal can include a casing, and a camera module received in the casing. The camera module can include an electrical connector, a camera spaced, a flexible printed circuit board (FPC), and a flash lamp. The camera is spaced from the electrical connector. The FPC is arranged between the camera and the electrical connector and is coupled to the camber and the electrical connector. The flash lamp is arranged on the FPC.

As illustrated in FIG. 1, a mobile terminal 100 in accordance with a first embodiment of the present disclosure is provided. The mobile terminal 100 can be any device with communication function and storage function, such as: a tablet, a mobile phone, an e-reader, a remote control, a personal computer (PC), a notebook computer, car device, a network television, a wearable device smart, or other smart device with network capabilities.

The mobile terminal 100 can include a casing 10 and a camera module 30. In this embodiment, the camera module 30 can be received in the casing 10.

In this embodiment, the casing 10 can include a rear cover 12. The rear cover 12 can define an through hole 121 therein. The camera module 30 can be coupled to the rear cover 12, and a surface of the camera module 30 can be exposed to the outside of the casing 10, via the through hole 121.

Figure 2:
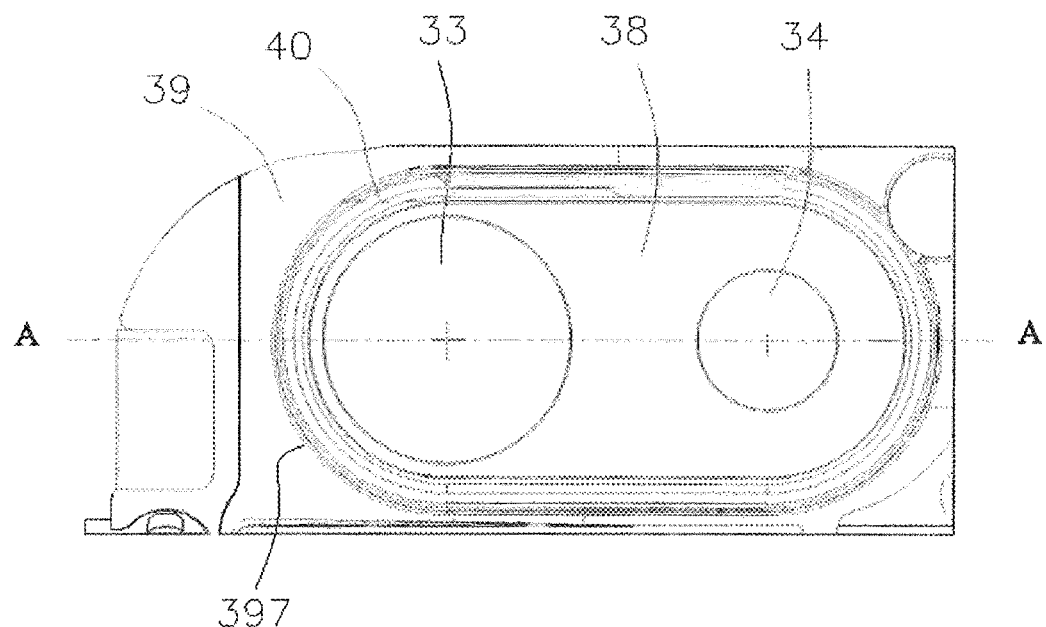
FIG. 2 illustrates a schematic view of a camera module of the mobile terminal of FIG. 1, in accordance with the first embodiment of the present disclosure.
Figure 3:
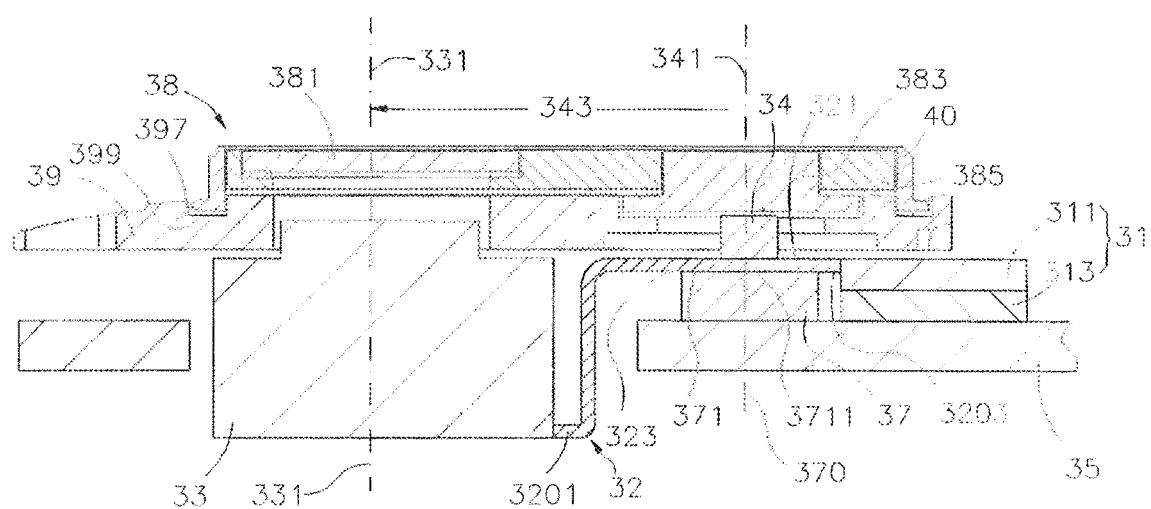
FIG. 3 illustrates a schematic cross-sectional view of the camera module of FIG. 2 taken along a line A-A, in accordance with the first embodiment of the present disclosure.

As illustrated in FIG. 2 and FIG. 3, in this embodiment, the camera module 30 can include an electrical connector 31, a flexible printed circuit (FPC) 32, a camera 33, and a flash lamp 34. The electrical connector 31 and the camera 33 can be spaced from each other. The FPC 32 can be disposed between the electrical connector 31 and the camera 33, and can be coupled to the electrical connector 31 and the camera 33. Thus the camera 33 can be electrically coupled to the electrical connector 31 by the FPC 32.

In this embodiment, the FPC 32 can have a first end 3201 and a second end 3203 opposite to the first send 3201. The first end 3201 can be coupled to the camera 33, and the second end can be coupled to the electrical connector 31. The flash lamp 34 can be disposed on the FPC 32. In some alternative embodiments, the flash lamp 34 can be positioned between the first end 3201 and the second end 3203, and can be coupled to the FPC 32.

In this embodiment, the camera 33 can have a first central axis 331, and the flash lamp 34 can have a second central axis 341. The second central axis 341 can be parallel to the first central axis 331. The second central axis 341 and the first central axis 331 can cooperatively define a space 343 therebetween. The electrical connector 31 can be arranged outside of the space 343 between the first central axis 331 and the second central axis 341. In some embodiments, the electrical connector 31 can be arranged at a side of the flash lamp 34 departing from the camera 33. In an alternative embodiment, the electrical connector 31 can be arranged at a side of the camera 33 departing form the flash lamp 34. In some alternative embodiments, the electrical connector 31 can be positioned in the space 343 when the FPC is in a bending manner.

In the first embodiment, the FPC 32 can be connected between the camera 33 and the electrical connector 31. The flash lamp 34 can be disposed on the FPC 32. The FPC 32 is generally thin and flexible, allowing the camera 33 and the flash lamp 34 to be disposed adjacent to each other.

In this embodiment, the mobile terminal 100 can further include a printed circuit board (PCB) 35. The electrical connector 31 can be coupled to the PCB 35. The electrical connector 31 can be a board-to-board connector. The electrical connector 31 can include a first board connector 311 and a second board connector 313. The first board connector 311 and the second board connector 313 can engage with each other.

The first board connector 311 can be coupled to the FPC 32, and can be electrically connected to the FPC 32. The second board connector 313 can be coupled to the PCB 35, and can be electrically connected to the PCB 35. In this embodiment, the second board connector 313 can be connected to the PCB 35 by using, for example, welding process. In an alternative embodiment, the electrical connector 31 can includes either the first board connector 311 or the second board connector 313.

The FPC 32 can include a top surface 321 and a bottom surface 323 at two opposite sides thereof. The top surface 321 and the bottom surface 3233 can be located between the flash lamp 34 and the PCB 35. The top surface 3231 can be coupled to the flash lamp 34, and the bottom surface 3233 can be configured to couple to the PCB 35 directly or indirectly.

In this embodiment, the mobile terminal 100 can further include a support base 37. The support base 37 can be arranged on the PCB 35. The support base 37 can be sandwiched between the PCB 35 and bottom surface 323 of the FPC 32, corresponding to the flash lamp 5. In some embodiments, an axis 370 of the support base 37 can be aligned with the second central axis 341 of the flash lamp 34, and the support base 37 can support the FPC 32. The support base 37 can be directly attached to FPC 32 or can indirectly resist the FPC 32 via an intermediate member such as a reinforcing member. In this embodiment, the FPC 32 and the flash lamp 34 can be supported by the support base 37, so that the FPC 32 and the flash lamp 34 can be prevented from swaying, a reliability of the camera module 30 and the mobile terminal 100 can be improved. In some alternative embodiments, the support base 37 may have a shape of a cylindrical shape, an elliptical cylindrical shape, a rectangular parallelepiped shape, a truncated cone shape.

As illustrated in FIG. 3, in this embodiment, the support base 37 can include a resisting surface 371. The resisting surface 371 can be coupled to the bottom surface 323 of the FPC 32. The resisting surface 371 can include a resisting portion 3711 attached to the FPC 32. The resisting portion 3711 may be the whole or a partial of the resisting surface 371. An area of the resisting portion 3711 is equal to or greater than a sectional area the flash lamp 34 taken along a direction parallel to the bottom surface 323. By this way, the support base 37 and the FPC 32 can cooperatively support the flash lamp 34 with a strong structure formed by the support base 37 and the FPC 32.

Figure 4:
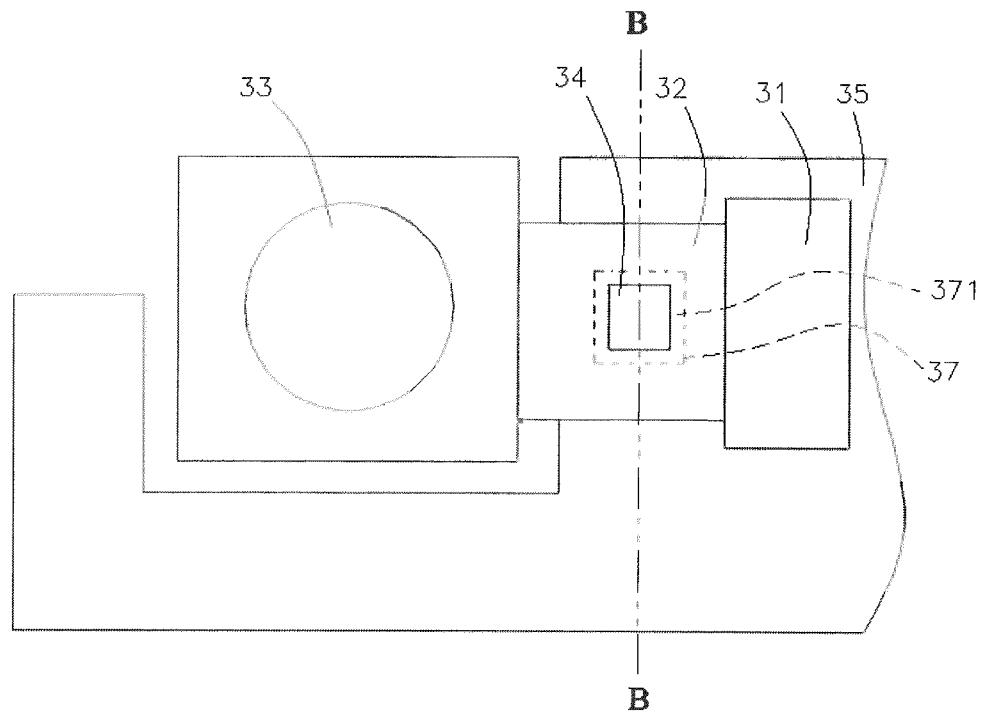
FIG. 4 illustrates a schematic view of the camera module of FIG. 3, in accordance with the first embodiment of the present disclosure.

In other words, as illustrated in FIG. 4, an orthographic projection of the flash lamp 34 can be created on the resisting surface 371, and the orthographic projection can be created within the resisting portion 3711. By this way, the support base 37 can support a portion of the FPC 32 to which the flash lamp 34 connected, a support relationship between the PCB 35, the support base 37, and the FPC 32 can be stable and reliable.

Figure 5:
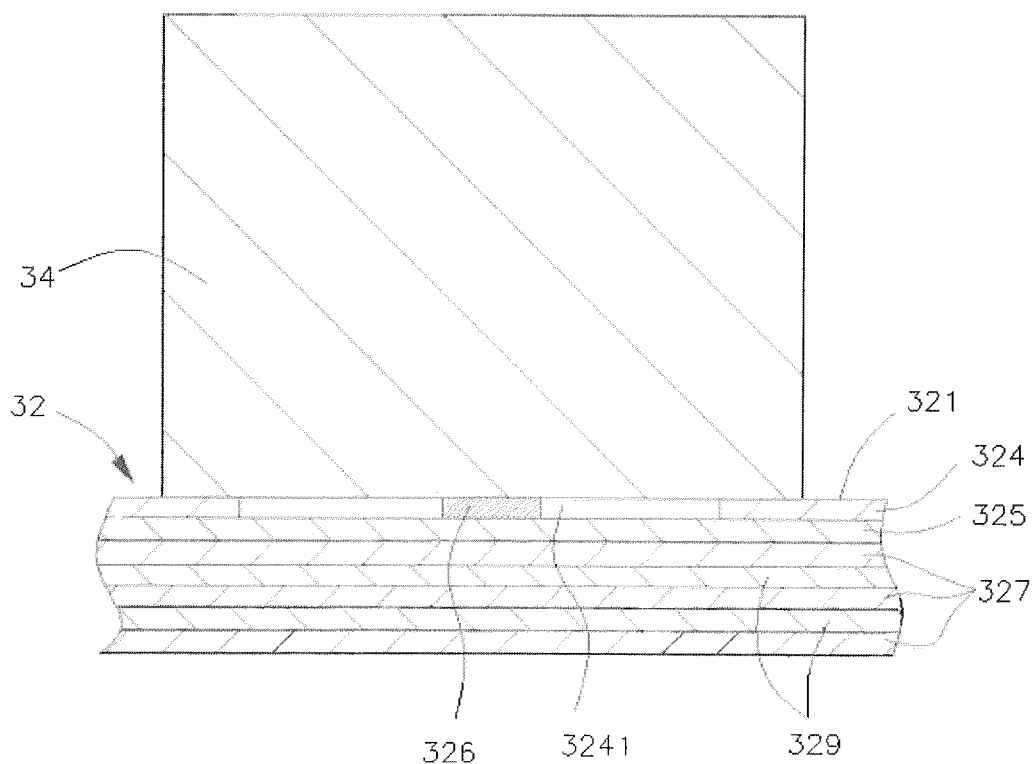
FIG. 5 illustrates a schematic cross-sectional view of a flash and an FPC of the camera module of FIG. 4 taken along a line B-B, in accordance with the first embodiment of the present disclosure.

As illustrated in FIG. 5, in this embodiment, the FPC 32 can further include a protective layer 324, a copper foil layer 325, and a conductor 326. The protective layer 324 and the copper foil layer 325 can be stacked to each other. The protective layer 324 can be connected with the flash lamp 34, and the top surface 321 can be a surface of the protective layer 324 which is departing from the copper foil layer 325. The protective layer 324 can define an access 3241 therein. A portion of the copper foil layer 325 can be exposed to the flash lamp 34 though the access 3241. The flash lamp 34 can be arranged on the protective layer 324 corresponding to the access 3241.

The conductor 326 can pass through the access 3241, and the conductor 326 can be coupled to both of the flash lamp 34 and the copper foil layer 325. Such that the flash lamp 34 can be electrically connected to the copper foil layer 325 by the conductor 326 passing through the access 3241. Therefore the flash lamp 34 can be electrically connected to the FPC 32 by electrically connecting with the copper foil layer 325. Such that the flash lamp 34 can be electrically connected to the PCB 35 via the FPC 32 and the electrical connector 31. In some embodiments, the conductor 326 can be an independent conductive element, which is arranged between the flash lamp 34 and the copper foil layer 325, such as a lead. In some alternative embodiments, the conductor 326 can be a conductive contact formed on the flash lamp 34, such as a conductive joint.

In this embodiment, the FPC 32 can further include a number of insulating layers 327 and a number of conductive layers 329. The insulating layers 327 and the conductive layers 329 can be disposed at a side of the copper foil layer 325 departing from the protective layer 324, in a stacking order.

The number of insulating layers 327 can be separated from each other by a conductive layer 329, and the number of conductive layers 329 can be separated from each other by an insulating layer 327. That is, an insulating layer 327 can be arranged between two adjacent conductive layers 329. The copper foil layer 325 and the conductive layer 329 can be separated from each other by an insulating layer 327. That is, an insulating layer 327 can be arranged between the copper foil layer 325 and the conductive layer 329. At least one of the copper foil layers 325 and the number of conductive layers 329 can be considered as a signal conductor of the FPC 3, and at least one of the copper foil layers 325 and the number of conductive layers 329 can be considered as an earth conductor of the FPC 3.

Figure 6:
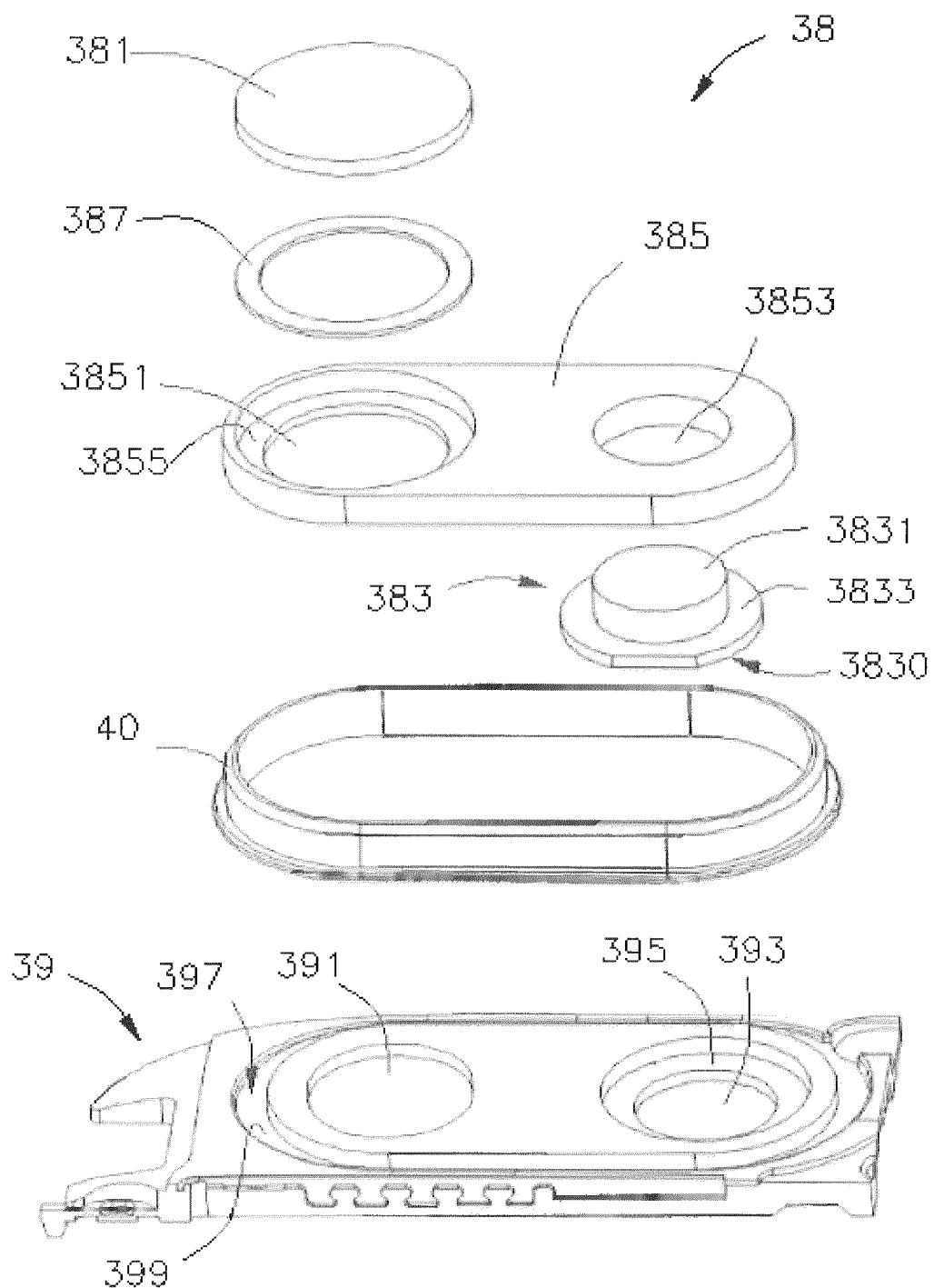
FIG. 6 illustrates a partial exploded perspective view of the camera module of FIG. 2, in accordance with the first embodiment of the present disclosure.

As illustrated in FIG. 3 and FIG. 6, in this embodiment, the camera module 20 can further include a cover assembly 38. The cover assembly 38 can be capped over the camera 33 and the flash lamp 34. The cover assembly 38 can be disposed at a side of the flash lamp 34 departing from the PCB 35. The cover assembly 38 can include a first transparent member 381, a second transparent member 383, and a cover member 385. The first transparent member 381 and the second transparent member 383 can be coupled to the cover member 385.

In this embodiment, the cover member 385 can define a first through hole 3851 and a second through hole 3853 therein. The first through hole 3851 and the second through hole 3853 can be spaced from each other.

In this embodiment, the first transparent member 381 can be a camera lens of the camera 33. The first transparent member 381 can be engaged in the first through hole 3851 corresponding to the camera 33. Such that the first transparent member 381 can face the camera 33, which allows an ambient light to pass through the transparent member 381 and reach the camera 33. A hardness of a material of the first transparent member 381 can be greater than a hardness of a material of the cover member 385. The first transparent member 381 can be made of sapphire glass. The sapphire glass is hard, and is not easy to wear; therefore a stability of the camera module 30 can be improved.

In this embodiment, the first through hole 3851 can be a stepped hole, the cover member 385 can include a first shoulder 3855 received in the first through hole 3851. The first shoulder 3855 can disposed departing from the camera 33. The first shoulder 3855 can be configured to support the first transparent member 381, that is, the first transparent member 381 can be stack on the first shoulder 3855. Such that the first transparent member 381 can be supported by the first shoulder 3855 when applied with an external force, and the first transparent member 381 can be prevented from pressing the camera 33. Thus the camera 33 can be protected from damage. In an alternative embodiment, the first transparent member 381 together with the cover member 385 can be an integrated body, the first transparent member 381 can be considered as a portion of the cover member 385, which is faced the camera 33.

In this embodiment, the cover assembly 38 can further include a gasket 387, and the gasket 387 can be sandwiched between the first transparent member 381 and the first shoulder 3855. The gasket 387 can be configured to connect the first transparent member 381 to the cover member 385. The gasket 387 can also be configured to act as a damper between the first transparent member 381 and the cover member 385.

In this embodiment, the second transparent member 383 can be a lens of the flash lamp 34. The second transparent member 383 can be engaged in the second through hole 3853. The second transparent member 383 can include a light incident surface 3830 facing the flash lamp 34. The light incident surface 3830 can be provided with Fresnel ripples, that is, the second transparent member 383 can be a Fresnel lens. A light emitting by the flash lamp 34 can pass through the second transparent member 385. In an alternative embodiment, the second transparent member 383 together with the cover member 385 can be an integrated body, the second transparent member 383 can be considered as a portion of the cover member 385, which is corresponding to the flash lamp 34.

In this embodiment, a top surface of the cover assembly 38 departing from the camera 33 can be smooth and flat, that is, the surface of the cover member 385 departing from the camera 33, a surface of the first transparent member 381 departing from the camera 33, and a surface of the second transparent member 383 departing from the camera 33 can be flush with each other. It can be facilitate to clean the cover assembly 38.

In this embodiment, the camera module 30 can further include a support member 39. The support member 39 can be disposed in the casing 1. In some embodiments, the support member 39 can be considered as a middle frame of the mobile terminal 100 or a portion of the middle frame. The support member 39 can be disposed between the cover assembly 38 and the camera 33, and disposed between the cover assembly 38 and the flash lamp 34. The cover assembly 38 can be stacked on and coupled to the support member 39.

The support member 39 can define a first transmission hole 391 and a second transmission hole 393 therein. The first transmission hole 391 can be disposed between the first through hole 3851 can the camera 33. A central axis of the first transmission hole 391 can be aligned to that of the first through hole 3851, and the first transmission hole 391 can communicate with the first through hole 3851. Such that the ambient light can pass through and reach the camera 33. The second transmission hole 393 can be disposed between the second through hole and the flash lamp 34. A central axis of the second transmission hole 393 can be aligned to that of the second through hole 3853, and the second transmission hole 393 can communicate with the second through hole 3853 to enable the light of the flash lamp 34 passing through.

In this embodiment, the second transmission hole 393 can be a stepped hole. The support member 39 can include a second shoulder 395 received in the second transmission hole 393, and the second shoulder 395 can face the cover member 385. The second transmission hole 393 can be configured to receive a partial portion of the second transparent member 383.

Furthermore, the second transparent member 383 can include an insert portion 3831 and a limit portion 3833. The limit portion 3833 can be coupled to an end of the insert portion 3831. And the limit portion 3833 can protrude from a periphery of the insert portion 3831. The limit portion 3833 can be received in the second transmission hole 393 and supported by the second shoulder 395. The insert portion 38511 can insert into the second through hole 3853. Such that the limit portion 3833 can be clamped by the cover member 385 and the second shoulder 395. The second transparent member 383 can be supported by the second shoulder 395 when applied with an external force, and the second transparent member 383 can be prevented from pressing the flash lamp 34. Thus the flash lamp 34 can be protected from damage.

In this embodiment, the camera module 30 can further include a decorative ring 40. The decorative ring 40 can be coupled to the support member 39. In addition, the support member 39 can define a positioning slot 397 in a side adjacent to the cover assembly 38 thereof. The decorative ring 40 can surround the cover assembly 38 and engage in the positioning slot 397. A size of the decorative ring 40 can be slightly larger than that of the cover assembly 38 so as to the decorative ring 40 can sleeve outside the cover assembly 38. Furthermore, the support member 39 can include a bottom surface 399 received in the positioning slot 397. The decorative ring 40 can be attached to the bottom surface 399 to be fixedly connected with the support member 39.

When the rear cover 12 covers the camera module 30, the decorative ring 40 and the cover assembly 38 can protrude through the through hole 121 (see in FIG. 2) of the rear cover 12. An outer surface of the camera module 30 can protrude out of an outer surface of the rear cover 12. The decorative ring 40 can be configured to protect the cover assembly 38 and can serve as a decoration.

Figure 7:
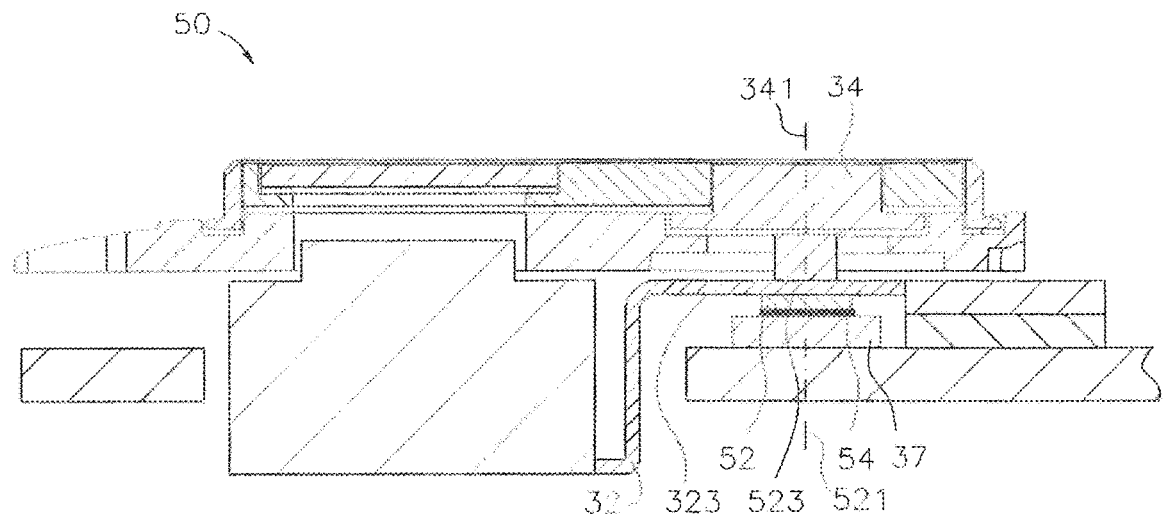
FIG. 7 illustrates a schematic cross-sectional view of the camera module of the mobile terminal of FIG. 2 taken along a line A-A, in accordance with a second embodiment of the present disclosure.

As illustrated in FIG. 7, a camera module 50 of the mobile terminal 100 can be provided, in accordance with a second embodiment of the present disclosure. A structure of the camera module 50 is similar to that of the camera module 30 of the first embodiment, and differences between the camera module 50 and the camera module 30 are described below.

Compared with the camera module 30, the camera module 50 can further include a reinforcing member 52. The reinforcing member 52 can be sandwiched between the bottom surface 323 and the support base 37, corresponding to the flash lamp 34. The reinforcing member 52 can be coupled to the bottom surface 3233.

Furthermore, the reinforcing member 52 can have an axis 521, and the axis 521 of the reinforcing member 52 can be approximately coaxially aligned with the second central axis 341 of the flash lamp 34. In assembly, the reinforcing member 52 can be attached to the bottom surface 323, and the flash lamp 34 can be coupled to the top surface 3231 by using, for example, welding process. In use, the flash lamp 34 can be stably supported on the FPC 32 by the reinforcing member 52 and the support base 37. Furthermore, in this embodiment, the flash lamp 34 can be supported by the FPC 32 and the reinforcing member 52, such that the FPC 32 and the flash lamp 34 can be protected by the reinforcing member 52 when the camera module 30 and the mobile terminal 100 is in use.

In this embodiment, the reinforcing member 52 can include an attaching surface 523 attached on the bottom surface 323. An area of the attaching surface 523 is equal to or greater than the sectional area the flash lamp 34 taken along a direction parallel to the bottom surface 323. By this way, the reinforcing member 52 and the FPC 32 can cooperatively support the flash lamp 34 with a strong structure formed by the reinforcing member 52 and the FPC 32.

In this embodiment, the mobile terminal 100 can further include an adhesive layer 54 sandwiched between the reinforcing member 52 and the support base 37. The adhesive layer 54 can be configured to connect the reinforcing member 52 to the support base 37. By this way, the adhesive layer 54 bonds the reinforcing member 52 and the support base 37, thereby the FPC 32 can be fixed to the support base 37. Thus the FPC 32 and the flash lamp 34 can be prevented from being separated from the support base 37 and swaying, and a stability of the camera module 50 and the mobile terminal 100 can be improved.

Figure 8:
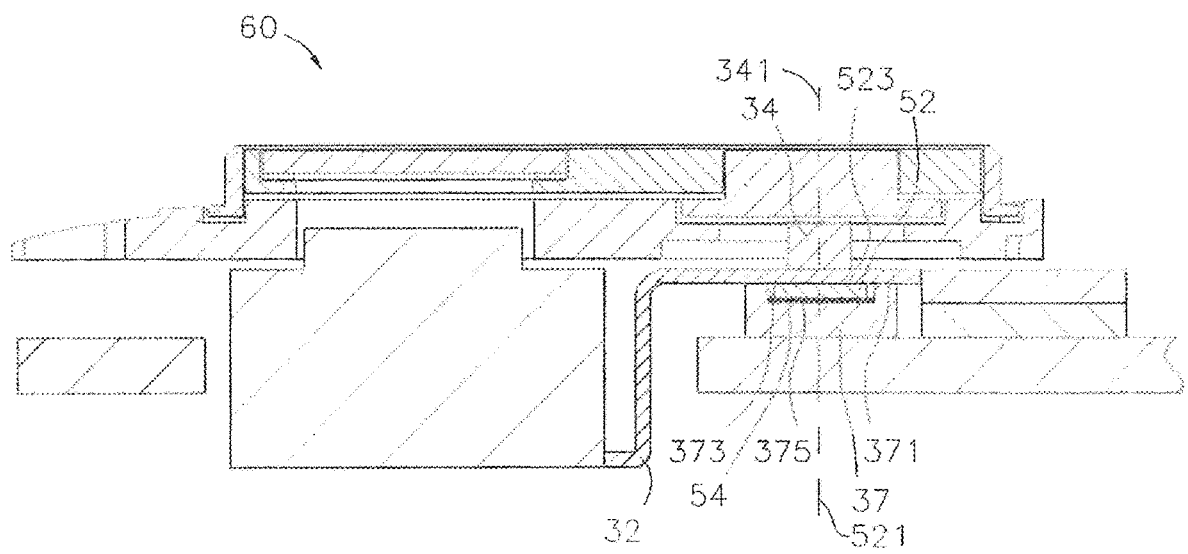
FIG. 8 illustrates a schematic cross-sectional view of the camera module of FIG. 2 taken along a line A-A, in accordance with a third embodiment of the present disclosure.
Figure 9:
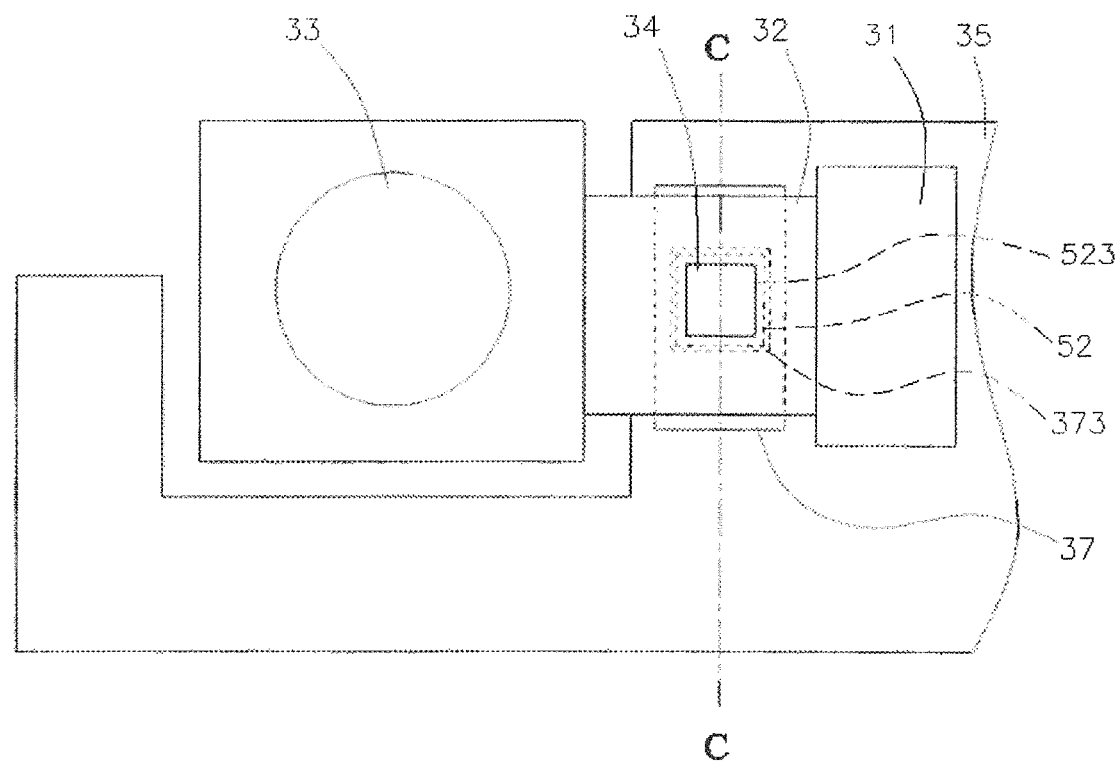
FIG. 9 illustrates a partial schematic view of the camera module of FIG. 8, in accordance with the third embodiment of the present disclosure.
Figure 10:
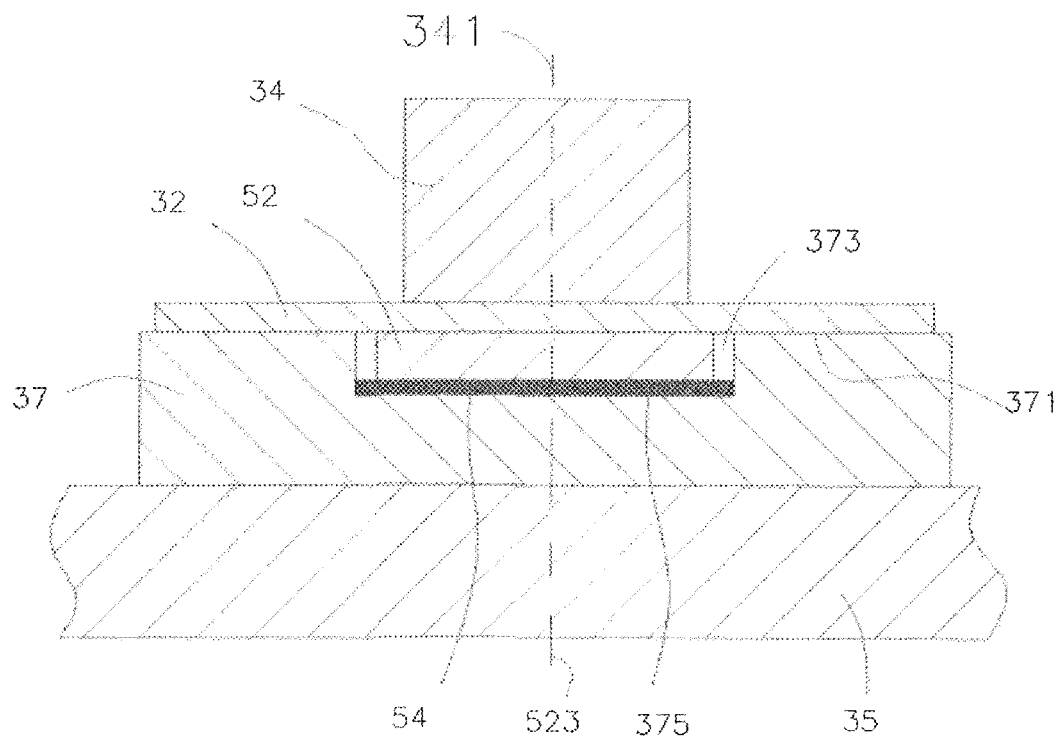
FIG. 10 illustrates a schematic cross-sectional view of the camera module of FIG. 9 taken along a line C-C, in accordance with the third embodiment of the present disclosure.

As illustrated in FIG. 8, FIG. 9, and FIG. 10, a camera module 60 of the mobile terminal 100 can be provided, in accordance with a third embodiment of the present disclosure. A structure of the camera module 60 is similar to that of the camera module 50 of the second embodiment, and differences between the camera module 60 and the camera module 50 are described below.

Compared with the camera module 50, the support base 37 of the camera module 60 can define a groove 373 in the resisting surface 371. The groove 373 can be recessed in a direction that towards the PCB 35. The groove 373 can be configured to receive and position the reinforcing member 52. When the reinforcing member 52 is received in the groove 373, the FPC 32 and the flash lamp 34 can be positioned.

Furthermore, the support base 37 of the camera module 60 can further include a boding surface 375 received in the groove 373. The boding surface 375 can be disposed at a bottom position of the groove 373, oppositely to an opening of the groove 373. The bonding surface 375 can be configured to support the reinforcing member 52, and the resisting surface 371 can be configured to support the FPC 32. By this way, the FPC 32 can be supported by the boding surface 375, the reinforcing member 52, and the resisting surface 371. A support relationship between the PCB 35, the support base 37, the reinforcing member 52, and the FPC 32 can be stable and reliable.

In this embodiment, the boding surface 375 can be bonded with the reinforcing member 52. The adhesive layer 54 can be sandwiched between the boding surface 375 and the reinforcing member 52. The adhesive layer 54 can be configured to connect the reinforcing member 52 to the boding surface 375. By this way, the adhesive layer 54 bonds the reinforcing member 52 and the boding surface 375, thereby the FPC 32 can be fixed to the support base 37. Thus the FPC 32 and the flash lamp 34 can be prevented from being separated from the support base 37 and swaying, and a stability of the camera module 30 and the mobile terminal 100 can be improved.

In some alternative embodiments, the FPC 32 may be supported only by the boding surface 375 and the reinforcing member 52, while a small gap can be left between the resisting surface 371 and the FPC 32. In other alternative embodiments, the FPC 32 may be supported only by the resisting surface 371, a small gap can be left between the boding surface 375 and the reinforcing member 52.

In accordance with the embodiments of the present disclosure, the camera 33 can be disposed adjacent to the flash lamp 34, the first transparent member 381 and the second transparent member 383 can be disposed adjacently, that is, the camera lens of the camera 33 and the lens of the flash lamp 34 can be disposed adjacently, a distance between the camera lens and the lens of the flash lamp 34 is small. So that an appearance of the mobile terminal 100 can be in an integral manner. Furthermore, it can be also possible for the camera module 30, 50, 60 to avoid occupying an arrangement space of other components (for example, an antenna feedpoints) on the rear cover 12. Additionally, since the camera lens and the lens of the flash lamp 34 can be both fixed to the cover member 385 as part of the cover assembly 38, the camera lens can be adjacent to the lens of the flash lamp 34, thus a visual effect of a dual cameras can be achieved, which can improves a user experience, and the camera lens and the lens of the flash lamp 34 can be assembled in only one process, thereby the process can be time-saving.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

The invention claimed is:

1. A camera module, comprising:
   a flexible printed circuit (FPC) having a first end and a second end opposite to the first end;
   a camera coupled to the first end of the FPC;
   an electrical connector coupled to the second end of the FPC;
   a flash lamp disposed on the FPC;
   a cover member capped over the camera and the flash lamp;
   a support member disposed between the cover member and the flash lamp; the support member defining a first transmission hole aligning with the camera and a second transmission hole aligning with the flash lamp;
   a first transparent member connected with the cover member and facing the camera; and
   a second transparent member in the second transmission hole and facing the flash lamp;
   wherein the second transmission hole is a stepped hole, the support member comprises a shoulder in the second transmission hole, the second transparent member is disposed in the second transmission hole and supported by the shoulder.

2. The camera module as claimed in claim 1, wherein the flash lamp is positioned between the first end and the second end of the FPC, and the flash lamp is coupled to the FPC.

3. The camera module as claimed in claim 1, further comprising a reinforcing member attached to the FPC to support the flash lamp; wherein the FPC further comprises a top surface and a bottom surface at two opposite sides of the FPC, the flash lamp is coupled to the top surface of the FPC, the reinforcing member is coupled to the bottom surface of the FPC corresponding to the reinforcing member; wherein an axis of the reinforcing member is aligned with an axis of the flash lamp.

4. The camera module as claimed in claim 3, wherein the reinforcing member comprises an attaching surface attached to the bottom surface of the FPC; and an area of the attaching surface is equal to or greater than a sectional area of the flash lamp taken along a direction parallel to the bottom surface of the FPC.

5. The camera module as claimed in claim 1, wherein the FPC comprises:
   a protective layer defining an access;
   a conductor passing through the access; and
   a copper foil layer arranged on the protective layer, the flash lamp being coupled to the protective layer; wherein the flash lamp is arranged on the protective layer and electrically connected to the copper foil layer by the conductor.

6. The camera module as claimed in claim 1, wherein the cover member defines a first through hole and a second through hole being spaced from the first through hole; the first transparent member is engaged in the first through hole, and the second transparent member is engaged in the second through hole.

7. The camera module as claimed in claim 6, wherein the first through hole is a stepped hole, the first transparent member comprises a shoulder received in the first through hole, and the first transparent member is supported by the shoulder in the first through hole.

8. The camera module as claimed in claim 6, wherein an axis of the first transmission hole is aligned with the first through hole, and an axis of the second transmission hole is aligned with the second through hole.

9. The camera module as claimed in claim 8, wherein an end of the second transparent member is received in the second transmission hole and in contact with the second shoulder, another end of the second transparent member is embedded in the second through hole.

10. The camera module as claimed in claim 8, further comprising a decorative ring surrounding the cover member; wherein the support member defines a positioning slot, the decorative ring engages with the positioning slot.

11. A mobile terminal, comprising a casing and a camera module, wherein the camera module is received in the casing, the camera module comprises:

a flexible printed circuit (FPC) having a first end and a second end opposite to the first end;

a camera coupled to the first end of the FPC;

an electrical connector coupled to the second end of the FPC;

a flash lamp disposed on the FPC;

a cover member capped over the camera and the flash lamp;

a support member disposed between the cover member and the flash lamp; the support member defining a first transmission hole aligning with the camera and a second transmission hole aligning with the flash lamp;

a first transparent member connected with the cover member and facing the camera; and a second transparent member in the second transmission hole and facing the flash lamp;

wherein the second transmission hole is a stepped hole, the support member comprises a shoulder in the second transmission hole, the second transparent member is disposed in the second transmission hole and supported by the shoulder.

12. The mobile terminal as claimed in claim 11, wherein the camera module further comprising a reinforcing member attached to the FPC and aligned with the flash lamp to support the flash lamp; an axis of the reinforcing member is aligned with an axis of the flash lamp.

13. The mobile terminal as claimed in claim 12, wherein the reinforcing member is sandwiched between the support base and the FPC.

14. The mobile terminal as claimed in claim 13, wherein the reinforcing member comprises an attaching surface attached to the FPC; and an area of the attaching surface is equal to or greater than a sectional area of the flash lamp taken along a direction parallel to the bottom surface of the FPC.

15. The mobile terminal as claimed in claim 13, wherein the support base defines a groove to receive the reinforcing member.

16. The mobile terminal as claimed in claim 13, further comprising an adhesive layer; wherein the adhesive layer is sandwiched between the reinforcing member and the support base.

17. The mobile terminal as claimed in claim 11, further comprising: a printed circuit board (PCB) and a support base being arranged on the PCB; wherein the electrical connector is coupled to the PCB, and the support base is disposed between the FPC and the PCB and corresponding to the flash lamp.

18. A mobile terminal, comprising:

a casing;

a camera module being received in the casing, the camera module comprising:

an electrical connector;

a camera being spaced from the electrical connector and having a first central axis;

a flexible printed circuit (FPC) being arranged between the camera and the electrical connector, and the FPC being coupled to the camera and the electrical connector; and a flash lamp being arranged on the FPC and having a second central axis, and the first central axis and the second central axis cooperatively defining a space therebetween, the electrical connector being arranged outside of the space;

a printed circuit board (PCB); and a support base arranged on the PCB;

wherein the electrical connector is coupled to the PCB, and the support base is disposed between the FPC and the PCB and corresponding to the flash lamp; an extremity of the first end is in contact with the camera, an extremity of the second end is in contact with the electrical connector; the FPC is bending, such that a distance along the second axis between the first end and the flash lamp is larger than a distance along the second axis between the second end and the flash lamp; and the PCB and the support base are arranged in the space defined between the first end and the second end of the FPC; and the PCB and the support base are arranged in the space defined between the first end and the second end of the FPC.

19. The mobile terminal as claimed in claim 18, further comprising a reinforcing member; wherein the FPC further comprises a top surface and a bottom surface at two opposite sides of the FPC, the flash lamp is coupled to the top surface of the FPC, the reinforcing member is coupled to the bottom surface of the FPC corresponding to the reinforcing member, and an axis of the reinforcing member is aligned with an axis of the flash lamp.

20. The mobile terminal as claimed in claim 19, wherein the support base defines a groove to receive the reinforcing member.

* * * * *